United States Patent
Nasu et al.

(10) Patent No.: US 7,537,658 B2
(45) Date of Patent: *May 26, 2009

(54) METHOD FOR PRODUCING EPITAXIAL SILICON WAFER

(75) Inventors: Yuichi Nasu, Hiratsuka (JP); Kazuhiro Narahara, Hiratsuka (JP)

(73) Assignee: Sumco Techxiv Corporation, Hiratsuka-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/793,155

(22) PCT Filed: Dec. 20, 2005

(86) PCT No.: PCT/JP2005/023342

§ 371 (c)(1),
(2), (4) Date: Jun. 14, 2007

(87) PCT Pub. No.: WO2006/068127

PCT Pub. Date: Jun. 29, 2006

(65) Prior Publication Data

US 2008/0131605 A1 Jun. 5, 2008

(30) Foreign Application Priority Data

Dec. 24, 2004 (JP) .............................. 2004-374094

(51) Int. Cl.
*C30B 15/20* (2006.01)

(52) U.S. Cl. .............................. 117/13; 117/15; 117/19; 117/20

(58) Field of Classification Search .................. 117/13, 117/15, 19, 20
See application file for complete search history.

(56) References Cited

U.S. PATENT DOCUMENTS

| 6,200,872 | B1 | 3/2001 | Yamada |
| 7,182,809 | B2 * | 2/2007 | Haga et al. ..................... 117/20 |
| 2007/0169683 | A1 * | 7/2007 | Haga et al. ..................... 117/13 |
| 2008/0131605 | A1 * | 6/2008 | Nasu et al. .................. 427/314 |

FOREIGN PATENT DOCUMENTS

| JP | 11-168106 A | 6/1999 |
| JP | 11-274162 A | 10/1999 |
| JP | 2002-20200 A | 1/2002 |
| JP | 2004-119446 A | 4/2004 |
| JP | 2005-244127 A | 9/2005 |

OTHER PUBLICATIONS

Notification Concerning Transmittal of International Preliminary Report on Patentability, Chapter 1 of the Patent Cooperation Treaty, and Written Opinion of the International Searching Authority, dated Jun. 26, 2007, for PCT/JP2005/023342, 4 sheets.

* cited by examiner

*Primary Examiner*—Felisa C Hiteshew
(74) *Attorney, Agent, or Firm*—Frishauf, Holtz, Goodman & Chick, P.C.

(57) ABSTRACT

An oxide film 13 on the surface of the substrate 11 and an inner wall oxide film 112 in a COP 111 exposed to the surface of the substrate 11 are removed by cleaning the surface of the substrate 11 with a hydrofluoric acid solution. The substrate 11 is then cleaned with ozone water, thereby forming an oxide film 13 on the surface of the substrate 11. Thereafter the substrate 11 is subjected to a heat treatment for removing the oxide film 13 on the surface of the substrate 11. Consequently, the COP 111 on the surface of the substrate 11 is planarized to be eliminated from the substrate surface. Thereafter an epitaxial layer 12 is formed on the surface of the substrate 11.

4 Claims, 8 Drawing Sheets

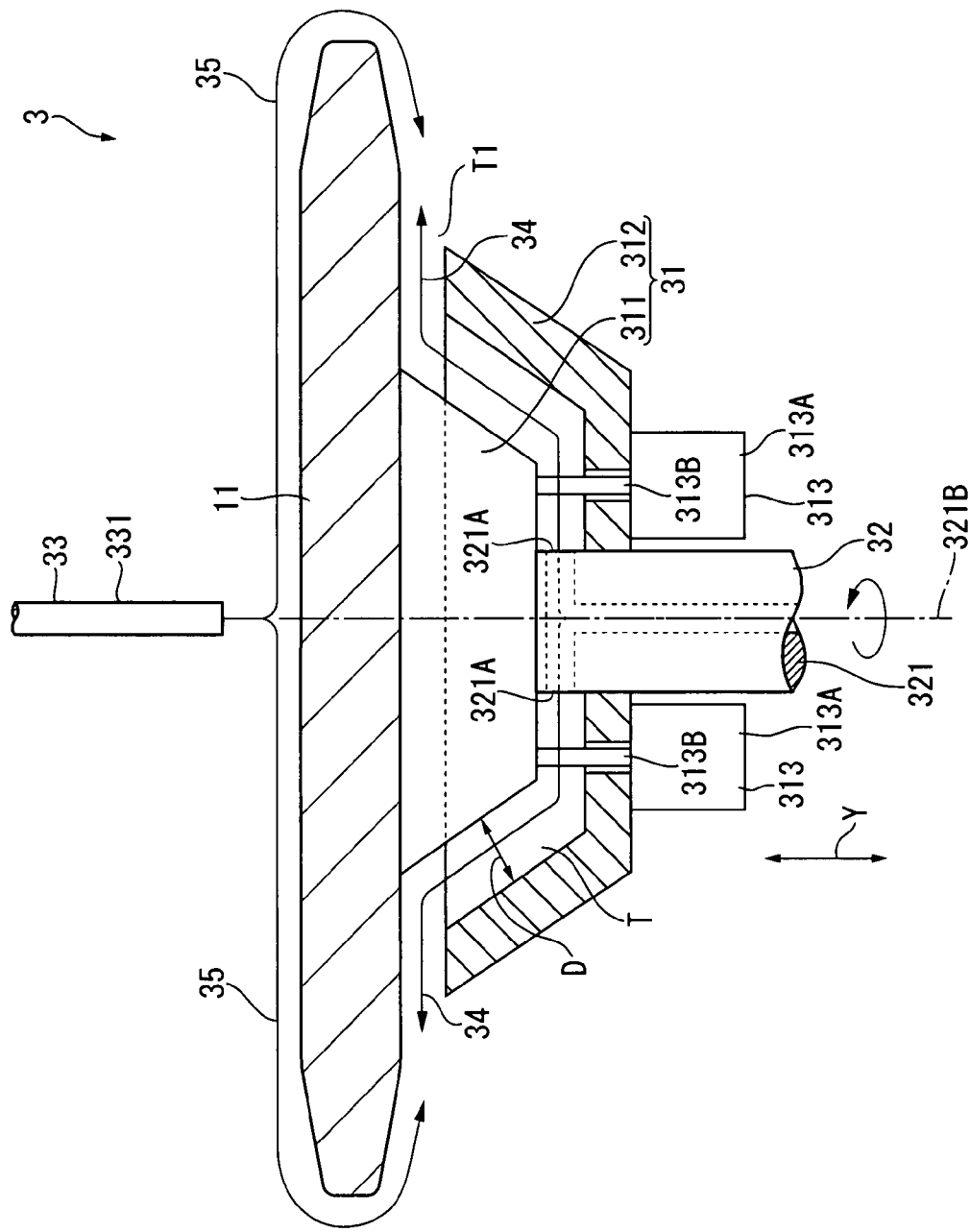

METHOD FOR PRODUCING EPITAXIAL SILICON WAFER

TECHNICAL FIELD

The present invention relates to a method for producing an epitaxial silicon wafer.

BACKGROUND ART

There has conventionally known an epitaxial silicon wafer having a substrate of a silicon single crystal and an epitaxial layer formed on a surface of the substrate.

Since contamination of metal impurities of the epitaxial layer of the epitaxial silicon wafer deteriorates device characteristics, the contamination of the metal impurities of the epitaxial layer is removed by gettering.

Specifically, the substrate is doped with nitrogen to form oxygen deposited nuclei inside the substrate, into which the metal impurities are captured to be gettered.

As shown in FIG. 4A, COP (Crystal Originated Particle), which is minute fault, exists not only on the surface of the nitrogen-doped substrate 11 but also inside the nitrogen-doped substrate 11. The COP 111 exposed to the surface of the substrate 11 (the COP opened to the substrate surface) becomes a cause of generating a SF (a stacking fault) in the epitaxial layer 12. Incidentally, the numeral 13 denotes the oxide film.

Heat treatment is one of the ways for removing the COP 111 exposed to the surface of the substrate 11. However, as shown in FIGS. 4B and 4C, in the nitrogen-doped substrate 11, due to inner wall oxide film 112 remaining inside the COP 111, the shape of the COP 111 tends to remain unchanged, so that the COP 111 can not be removed only by heat treatment. Thus, as shown in FIG. 4D, the stacking fault 121 is generated in the epitaxial layer 12.

In order to remove the inner wall oxide film 112 inside the COP 111, it is proposed that the substrate 11 is cleaned with a hydrofluoric acid solution to remove the inner wall oxide film 112 inside the COP 111 (see, for example, Patent Document 1).

With this method, after the surface of the substrate 11 is cleaned with the hydrofluoric acid solution, particles are apt to adhere on the surface of the substrate 11. To prevent the particles from adhering on the surface of the substrate 11, an oxide film is formed by cleaning the surface of the substrate 11 with SC-1 (ammonia aqueous hydrogen peroxide) after being cleaned with the hydrofluoric acid solution.

[Patent Document 1] Japanese Patent Laid-Open Publication No. 2002-20200 (Page 2 to Page 5)

DISCLOSURE OF THE INVENTION

Problems to be Solved by the Invention

However, with this method, although the inner wall oxide film 112 inside the COP 111 is removed by the hydrofluoric acid solution, the number of the stacking fault on the epitaxial layer of the epitaxial silicon wafer can not be sufficiently reduced.

An object of the present invention is to provide a method for producing epitaxial silicon wafer in which the number of the stacking fault of the epitaxial layer on the epitaxial silicon wafer can be sufficiently reduced.

Means for Solving the Problems

As a result of various zealous studies, the inventors of the present invention have confirmed that the surface of the substrate is etched by cleaning the surface of the substrate with the SC-1 (ammonia aqueous hydrogen peroxide) after being cleaned with the hydrofluoric acid solution.

To describe the details with reference to the attached drawings: by treating the substrate 11 as shown in FIG. 5A with the hydrofluoric acid solution, the oxide film 13 on the surface of the substrate 11 and the inner wall oxide film 112 inside the COP 111 (111A) opened to the surface of the substrate 11 are removed, as shown in FIG. 5B.

Next, as shown in FIG. 5C, when the surface of the substrate 11 is cleaned with the SC-1 (ammonia aqueous hydrogen peroxide), the oxide film 13 is formed on the surface of the substrate 11, and at the same time the surface of the substrate 11 is etched to expose the COP 111 (111B) inside the substrate 11 onto the surface of the substrate 11.

The inner wall oxide film 112 inside the COP 111A exposed to the surface of the substrate 11 when the substrate 11 is cleaned with the hydrofluoric acid solution is removed by being cleaned with the hydrofluoric acid solution, but the inner wall oxide film 112 of the COP 111B buried inside the substrate 11 is not removed by being cleaned with the hydrofluoric acid solution.

By performing the heat treatment as shown in FIGS. 5D and 5E after cleaning with the SC-1, the COP 111A whose inner wall oxide film 112 has been removed disappears, but the COP 111B whose inner wall oxide film 112 has not been removed keeps its shape unchanged and therefore does not disappear. In other words, since the inner wall oxide film 112 is difficult to be reduced by the heat treatment, the inner wall oxide film 112 does not disappear, so that migration of atoms of the silicon during the heat treatment is obstructed, and the shape of the COP 111B remains unchanged.

When the shape of the COP 111B remains unchanged, as shown in FIG. 5F, a misfit due to the COP 111B is caused in forming the epitaxial layer 12, and the stacking fault 121 of the epitaxial layer 12 is generated.

The present invention is devised based on the above knowledge.

A method for producing epitaxial silicon wafer according to the present invention is a method for an epitaxial silicon wafer which includes a substrate obtained by cutting a nitrogen-doped silicon single crystal produced by Czochralski method and an epitaxial layer formed on the substrate, the method comprising: a hydrofluoric acid cleaning step for cleaning the substrate with a liquid containing hydrofluoric acid; an oxide film forming step for forming an oxide film on the surface of the substrate without exposing an unexposed fault inside the substrate to the surface of the substrate; and an epitaxial layer forming step for, after performing a heat treatment on the substrate on which the oxide film is formed, forming an epitaxial layer on the substrate.

With such an arrangement, in the oxide film forming step, after the substrate is cleaned with the liquid containing hydrofluoric acid, the oxide film is formed on the surface of the substrate without exposing the fault inside the substrate to the surface of the substrate. In other words, the oxide film is formed on the surface of the substrate substantially without etching the surface of the substrate.

Thus, when forming the oxide film, the fault inside the substrate is not exposed to the surface of the substrate.

Since the fault that has not been cleaned with the liquid containing hydrofluoric acid is not exposed to the surface, the fault exposed to the surface of the substrate can be securely eliminated by performing the heat treatment.

Further, since the fault on the surface of the substrate can be securely eliminated by performing the heat treatment, when forming the epitaxial layer on the substrate, the stacking fault of the epitaxial layer caused by the fault exposed to the surface of the substrate can be reduced.

According to the present invention, it is preferred that in the oxide film forming step, the oxide film is formed on the surface of the substrate by cleaning the surface of the substrate with an aqueous hydrogen peroxide solution or an ozone water solution.

With such an arrangement, in the oxide film forming step, by cleaning the surface of the substrate with an aqueous hydrogen peroxide solution (for example, aqueous hydrogen peroxide and a mixed solution of hydrogen peroxide and hydrochloric acid) or an ozone water solution, the oxide film can be formed without exposing the fault inside the substrate to the surface of the substrate.

According to the present invention, it is preferred that in the hydrofluoric acid cleaning step, the substrate is cleaned using a rotary cleaning device which includes: a dropping section for dropping the liquid containing hydrofluoric acid on one surface of the substrate; a holding section for holding the other surface of the substrate; and a rotating section for rotating the substrate with an axis passing through the surface of the substrate held by the holding section as a rotation center axis, the dropping section drops the liquid containing hydrofluoric acid to clean the substrate while rotating the substrate at a rotating speed of 10 rpm or less by the rotating section.

In the hydrofluoric acid cleaning step, when dropping the liquid containing hydrofluoric acid on the surface of the substrate to clean the surface of the substrate, the oxide film on the surface of the substrate is removed, and the surface of the substrate becomes water repellent.

In the state where the surface of the substrate becomes water repellent, when the rotating speed of the substrate is higher than 10 rpm, the liquid containing hydrofluoric acid dropped on the surface of the substrate is swept away outward due to the rotation of the substrate, so that the oxide film on the surface of the substrate and the inner wall oxide film of the fault exposed to the surface of the substrate can not be securely removed by the liquid containing hydrofluoric acid.

To solve this problem, in the present invention, since the rotating speed of the substrate is set to 10 rpm or less, the liquid containing hydrofluoric acid dropped on the surface of the substrate is less likely to be swept away outward from the substrate and the liquid containing hydrofluoric acid remains on the surface of the substrate, so that the oxide film on the surface of the substrate and the inner wall oxide film of the fault exposed to the surface of the substrate can be securely removed.

BRIEF DESCRIPTION OF DRAWINGS

FIG. 3 is a schematic illustration showing a cleaning device used for a method for producing the epitaxial silicon wafer;

Figure 1:
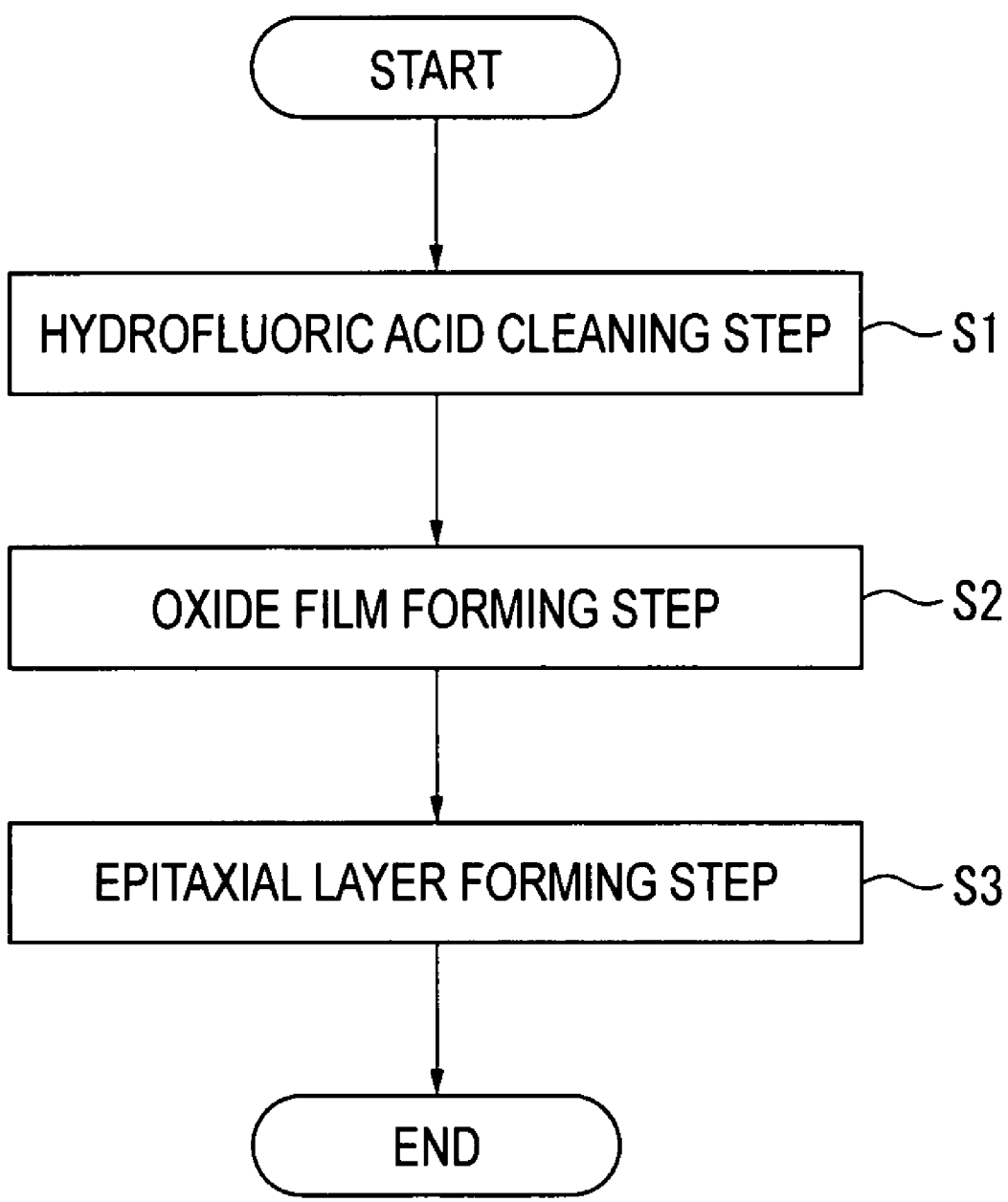
FIG. 1 is a flowchart illustrating producing process of an epitaxial silicon wafer according to a first embodiment of the invention.

EXPLANATION OF CODES 1 epitaxial silicon wafer
3 rotary cleaning device
11 substrate
12 epitaxial layer
13 oxide film
31 holding section
32 rotating section
33 dropping section
34 gas
35 hydrofluoric acid solution
112 inner wall oxide film
121 stacking fault
311 inner chuck
312 outer chuck
313 hydraulic cylinder
313A cylinder
313B piston
321 rotary shaft
321A hole
321B rotation center axis
331 nozzle
111 (111A, 111B) COP
T discharge passage
T1 outlet

BEST MODE FOR CARRYING OUT THE INVENTION

A preferred embodiment of the present invention will be described below with reference to the attached drawings.

As showing in FIG. 1, a method for producing an epitaxial silicon wafer includes a hydrofluoric acid cleaning step (Step S1), an oxide film forming step (Step S2) and an epitaxial layer forming step (Step S3).

Figure 2A:
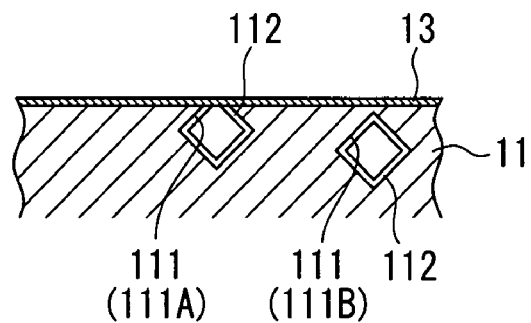
FIG. 2A is a schematic illustration showing one of the steps for producing the epitaxial silicon wafer.
Figure 2B:
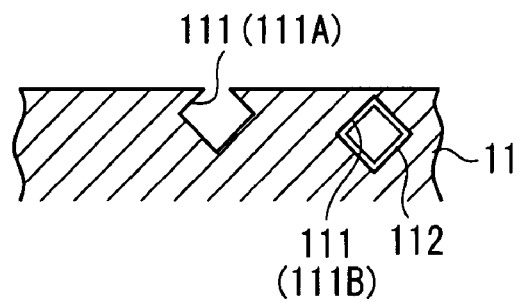
FIG. 2B is a schematic illustration showing another one of the steps for producing the epitaxial silicon wafer.
Figure 2C:
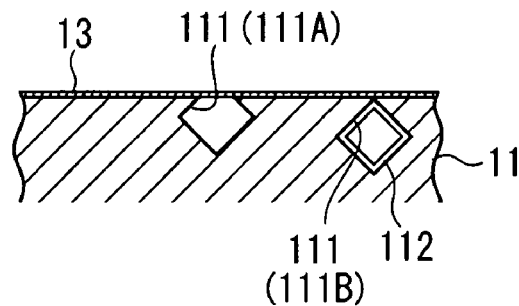
FIG. 2C is a schematic illustration showing still another one of the steps for producing the epitaxial silicon wafer.
Figure 2D:
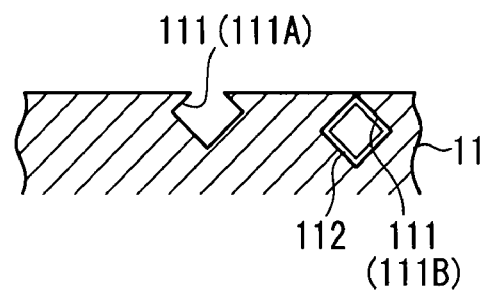
FIG. 2D is a schematic illustration showing a further one of the steps for producing the epitaxial silicon wafer.
Figure 2E:
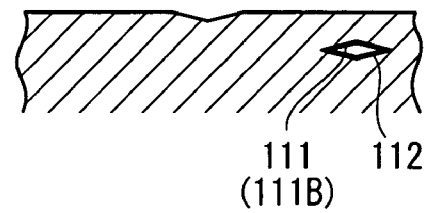
FIG. 2E is a schematic illustration showing a still further one of the steps for producing the epitaxial silicon wafer.
Figure 2F:
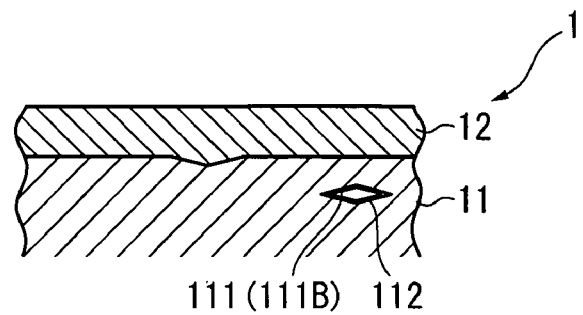
FIG. 2F is a schematic illustration showing a still further one of the steps for producing the epitaxial silicon wafer.
Figure 4A:
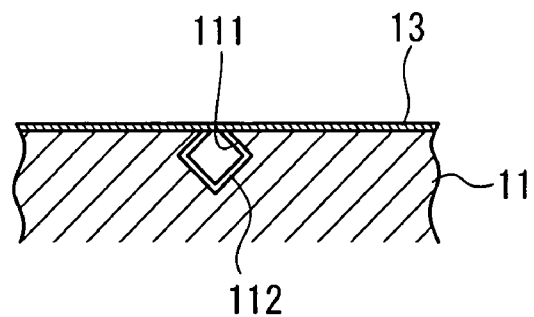
FIG. 4A is a schematic illustration showing one of the steps for producing an epitaxial silicon wafer according to a prior art.
Figure 4B:
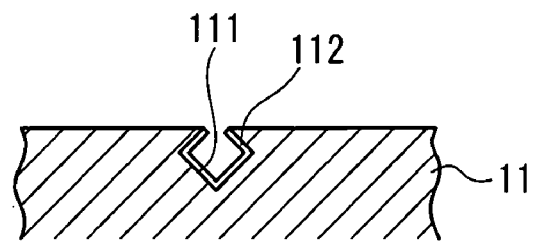
FIG. 4B is a schematic illustration showing another one of the steps for producing the epitaxial silicon wafer according to the prior art.
Figure 4C:
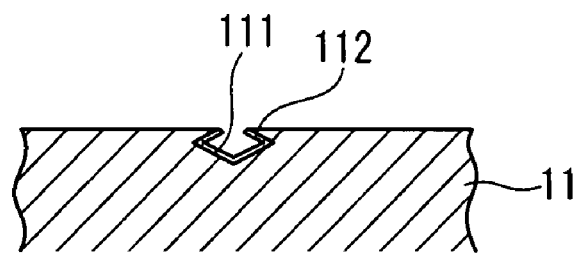
FIG. 4C is a schematic illustration showing still another one of the steps for producing the epitaxial silicon wafer according to the prior art.
Figure 4D:
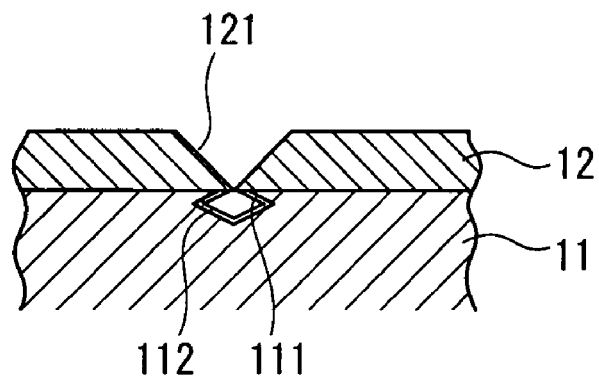
FIG. 4D is a schematic illustration showing a further one of the steps for producing the epitaxial silicon wafer according to the prior art.
Figure 5A:
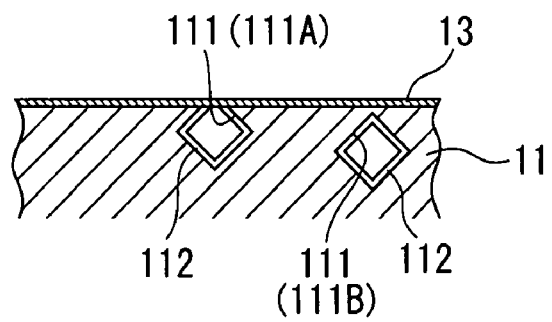
FIG. 5A is a schematic illustration showing one of the steps for producing the epitaxial silicon wafer according to the prior art.
Figure 5B:
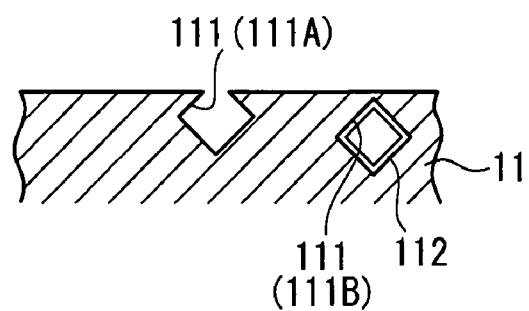
FIG. 5B is a schematic illustration showing another one of the steps for producing the epitaxial silicon wafer according to the prior art.
Figure 5C:
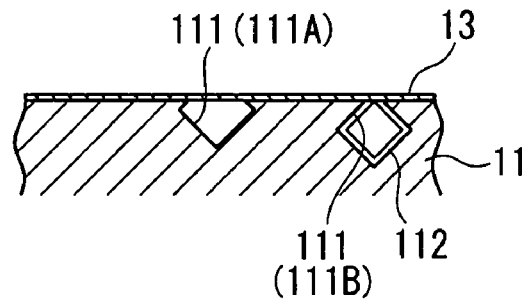
FIG. 5C is a schematic illustration showing still another one of the steps for producing the epitaxial silicon wafer according to the prior art.
Figure 5D:
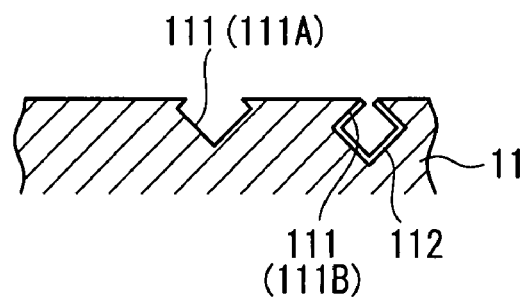
FIG. 5D is a schematic illustration showing a further one of the steps for producing the epitaxial silicon wafer according to the prior art.
Figure 5E:
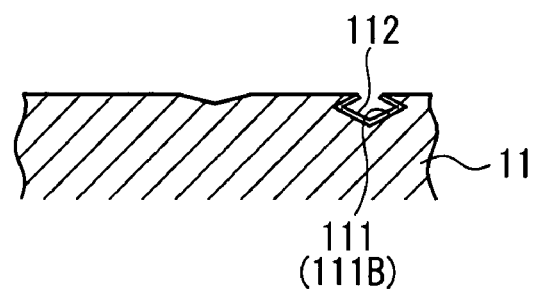
FIG. 5E is a schematic illustration showing a still further one of the steps for producing the epitaxial silicon wafer according to the prior art.
Figure 5F:
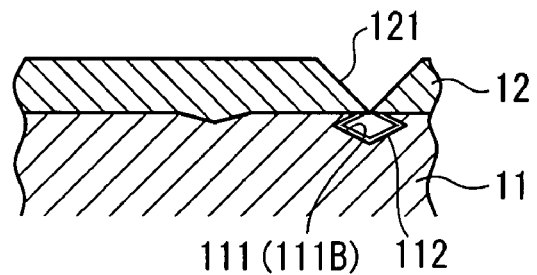
FIG. 5F is a schematic illustration showing a still further one of the steps for producing the epitaxial silicon wafer according to the prior art.

As showing in FIG. 2F, an epitaxial silicon wafer 1 includes a substrate 11 and an epitaxial layer 12 formed on the substrate 11.

The substrate 11 of the epitaxial silicon wafer 1 is produced by growing an ingot of a nitrogen-doped silicon single crystal by a CZ method and cutting the ingot.

Concentration of nitrogen inside the substrate 11 can be set to such a level that an OSF core (oxidation-induced stacking fault) is not exposed onto the surface of the substrate. Particularly, the concentration of nitrogen inside the substrate 11 is preferably set to $1 \times 10^{14}$ atoms/cm$^3$ or less.

The substrate grown by the CZ method and cut is subjected to machining processes such as chamfering, surface grinding, polishing and the like to become the substrate 11 having a mirror finished surface.

As shown in FIG. 2A, a COP 111 (111A), i.e. a fault, is exposed to the surface of the substrate 11. Further, a COP 111 (111B) also exists inside the substrate 11. An inner wall oxide film 112 is formed inside each of the COPs 111 (111A, 111B).

Further, an oxide film 13 is formed on the surface of the substrate 11.

(Hydrofluoric Acid Cleaning Step)

The surface of the substrate 11 having been subjected to the aforesaid machining processes is cleaned with a hydrofluoric acid solution (Step S1).

As shown in FIG. 2B, the oxide film 13 on the surface of the substrate 11 and the oxide film 112 in the COP 111A exposed to the surface of the substrate 11 are removed by being cleaned with the hydrofluoric acid solution.

A rotary cleaning device 3 shown in FIG. 3 is used for performing the hydrofluoric acid cleaning step.

The rotary cleaning device 3 includes a holding section 31 for holding the substrate 11, a rotating section 32 for rotating the holding section 31, and a dropping section 33 for dropping the hydrofluoric acid solution 35 on one surface of the substrate 11.

The holding section 31 abuts on the other surface of the substrate 11. The holding section 31 includes an inner chuck 311 that holds the substrate 11 and an outer chuck 312 that is disposed outside the inner chuck 311.

The inner chuck 311 has a shape of a hollow truncated cone. The diameter of an upper face (the face on the substrate 11 side) of the inner chuck 311 is greater than that of a lower face.

The outer chuck 312 has a shape of a hollow truncated cone larger than the inner chuck 311. An upper face of the outer chuck 312 on the substrate 11 side is opened. Thus, a clearance is formed between the outer chuck 312 and the inner chuck 311. Gas 34 injected into the inside of a rotary shaft 321 is discharged through the rotary shaft 321 to the clearance. Thus, the clearance forms a part of a below-mentioned discharge passage T of the gas 34. The gas 34 is discharged from an outlet T1 of the discharge passage T toward a periphery portion of the substrate 11 mounted on the inner chuck 311.

The outer chuck 312 can be moved relative to the inner chuck 311 in a vertical direction (a direction of the arrow Y). For example, the outer chuck 312 is provided with hydraulic cylinders 313 or the like to move the outer chuck 312 upward and downward. Cylinders 313A of the hydraulic cylinders 313 are attached on the outer surface of a lower face of the outer chuck 312, and pistons 313B penetrate the lower face of the outer chuck 312. Tip ends of the pistons 313B are fixed on the lower face of the inner chuck 311. Thus, the outer chuck 312 can be moved relative to the inner chuck 311 in a vertical direction.

The rotating section 32 rotates the inner chuck 311 of the holding section 31. The rotating section 32 includes a rotary shaft 321 attached on the lower face of the inner chuck 311, and a driving device (not shown) for rotating the rotary shaft 321.

The rotary shaft 321 is a hollow component. An upper end of the rotary shaft 321 is fixed to the lower face of the inner chuck 311. A rotation center axis 321B of the rotary shaft 321 passes through the plane center of the surface of the substrate.

Further, a hole 321A is formed near the upper end of the rotary shaft 321. The gas 34 injected from a lower end of the rotary shaft 321 flows through the inside of the rotary shaft 321 and fills the clearance between the inner chuck 311 and the outer chuck 312 through the hole 321A. The gas 34 is discharged from the outlet T1. In other words, the inside of the rotary shaft 321 and the clearance between the inner chuck 311 and the outer chuck 312 constitute the discharge passage T of the gas 34.

Incidentally, since the gas 34 is discharged from the outlet T1 of the discharge passage T, a negative pressure is generated on the side of the other surface of the substrate 11. Owing to this negative pressure, the other surface of the substrate 11 abuts on the upper face of the inner chuck 311, so that the substrate 11 is fixed to the inner chuck 311.

Here, dry oxygen, for example, is used as the gas 34.

The dropping section 33 includes a nozzle 331 for dropping the hydrofluoric acid solution 35 on the substrate 11. The nozzle 331 faces the inner chuck 311. A delivery port of the nozzle 331 is disposed at the plane center of the substrate 11, namely, coaxially with the rotation center axis 321B.

Thus, when the hydrofluoric acid solution 35 is dropped from the nozzle 331 while the substrate 11 is rotating, the hydrofluoric acid solution 35 spreads from the center toward the periphery portion of the substrate 11 due to the centrifugal force and is, as shown in FIG. 3, turned around toward the side of the other surface of the substrate 11 passing through the periphery portion.

The concentration of the hydrofluoric acid solution 35 is not particularly limited and can be, for example, 1% to 10%.

The method for cleaning the substrate 11 using the rotary cleaning device 3 will be described below.

First, the substrate 11 is mounted on the inner chuck 311. Next, the gas 34 is injected into the inside of the rotary shaft 321. The gas 34 flows through the inside of the rotary shaft 321 and the clearance between the inner chuck 311 and the outer chuck 312, to be discharged from the outlet T1.

Next, the rotary shaft 321 is rotated, and then the hydrofluoric acid solution 35 is dropped from the nozzle 331 of the dropping section 33.

Herein, the rotating speed of the rotary shaft 321 (namely, the rotating speed of the substrate 11) is set to 10 rpm or less, preferably 2 rpm or less.

The hydrofluoric acid solution 35 spreads from the center toward the periphery portion of the substrate 11, and is turned to the side of the other surface of the substrate 11 passing through the periphery portion.

Incidentally, the quantity of the hydrofluoric acid solution 35 being turned to the side of the other surface of the substrate 11 can be adjusted by controlling the rotating speed of the substrate 11, the delivering quantity of the hydrofluoric acid solution 35, the viscosity of the hydrofluoric acid solution 35, and the discharge pressure of the gas discharged from the outlet T1.

(Oxide Film Forming Step)

Next, an oxide film 13 is formed on the surface of the substrate 11 as shown in FIG. 2C (Step S2).

Since the substrate 11 cleaned with the hydrofluoric acid solution 35 has no oxide film on its surface and therefore particles are apt to adhere thereto, it is necessary to form an oxide film 13 on the surface of the substrate 11.

In the oxide film forming step, the oxide film is formed using the rotary cleaning device 3 used in the hydrofluoric acid cleaning step.

Specifically, the substrate 11 is mounted on the inner chuck 311, and the gas 34 is injected into the inside of the rotary shaft 321 so that the gas 34 flows through the inside of the rotary shaft 321 and the clearance between the inner chuck 311 and the outer chuck 312 and is discharged from the outlet T1.

Next, the rotary shaft 321 is rotated, and then the ozone water is dropped from the nozzle 331 of the dropping section 33.

At this time, the rotating speed of the rotary shaft 321 (namely, the rotating speed of the substrate 11) is set to about 500 rpm.

The dropping of the ozone water is stopped after about 60 seconds after staring the dropping of the ozone water is started.

Thereafter, the substrate 11 is continued to be rotated at the speed of about 500 rpm to carry out spin drying, and the oxide film forming step is finished.

(Epitaxial Layer Forming Step)

Next, the epitaxial layer 12 is formed on the surface of the substrate 11 (Step S3).

First, as shown in FIG. 2E, a heat treatment is performed on the substrate 11. For example, the heat treatment is performed on the substrate 11 under the atmosphere of hydrogen.

With this heat treatment, the oxide film 13 on the surface of the substrate 11 is removed. Further, the COP 111A on the surface of the substrate 11 is planarized and thus eliminated from the substrate surface.

Thereafter the epitaxial layer 12 is formed on the surface of the substrate 11.

Specifically, the substrate 11 is mounted on an epitaxial layer growth device (not shown) to form the epitaxial layer 12 on the substrate 11 using a metal organic chemical vapor deposition method (MOCVD method), a molecular beam epitaxy method (MBE method) or the like.

The epitaxial silicon wafer 1 is thus prepared.

According to the present embodiment, the following advantages can be achieved.

(1) In the oxide film forming step, after cleaning the substrate 11 with the hydrofluoric acid solution 35, the surface of the substrate 11 is cleaned with the ozone water to form the oxide film 13 on the surface of the substrate 11. By cleaning the surface of the substrate 11 with the ozone water, the oxide film 13 can be formed on the surface of the substrate 11 without exposing the COP 111B as the fault inside the substrate 11 to the surface of the substrate 11. In other words, the oxide film 13 can be formed on the surface of the substrate 11 substantially without etching the surface of the substrate 11.

Thus, when forming the oxide film 13, the COP 111B as the fault inside the substrate 11 is not exposed to the surface of the substrate 11.

Since the COP 111B, which has not been cleaned with the hydrofluoric acid solution 35, is not exposed to the surface, the COP 111B is not left on the surface of the substrate 11 by the heat treatment in the subsequent stage.

Since the heat treatment securely eliminates the COP 111A on the surface of the substrate 11 and the COP 111B inside the substrate 11 is not left on the surface of the substrate 11, when forming the epitaxial layer 12 on the substrate 11, faults on the epitaxial layer 12 can be reduced.

(2) In the hydrofluoric acid cleaning step, when dropping the hydrofluoric acid solution 35 on the surface of the substrate 11 to clean the surface of the substrate 11, the oxide film 13 on the surface of the substrate 11 is removed and the surface of the substrate 11 becomes water repellent.

In this state, when the rotating speed of the substrate 11 is higher than 10 rpm, the hydrofluoric acid solution 35 dropped on the surface of the substrate 11 is swept away outward due to the rotation of the substrate 11, so that the oxide film 13 on the surface of the substrate 11 and the inner wall oxide film 112 of the COP 111 on the surface of the substrate 11 can not be securely removed by the hydrofluoric acid solution 35.

On the other hand, since the rotating speed of the substrate 11 is set to 10 rpm or less in the present embodiment, the hydrofluoric acid solution 35 dropped on the surface of the substrate 11 is less likely to be swept away outwardly from the substrate 11 and the hydrofluoric acid solution 35 remains on the surface of the substrate 11 so that the oxide film 13 on the surface of the substrate 11 and the inner wall oxide film 112 of the COP 111 on the surface of the substrate 11 can be securely removed.

(3) In the present embodiment, the rotary cleaning device 3 is used in both the hydrofluoric acid cleaning step and the oxide film forming step. The rotary cleaning device 3 processes the substrate 11 one by one.

For example, when the hydrofluoric acid solution is stored in a tank and a plurality of substrates are dipped in the tank, there is possibility that the substrate will be effected by impurities discharged from other substrates adjacent thereto. In the present embodiment, since a so called single-wafer rotary cleaning device 3, which processes the substrate 11 one by one, is employed, the substrate 11 is not contaminated by other substrates.

Further, since the rotary cleaning device 3 processes the substrate 11 one by one, the rotary cleaning device 3 can be downsized as compared to an arrangement in which a tank for dipping a plurality of substrates 11 therein is provided.

It is to be understood that the present invention is not limited to the embodiments described above, and various modifications and improvements can be made as long as an object of the present invention can be achieved.

For example, although the substrate 11 is cleaned using the rotary cleaning device 3 as shown in FIG. 3 in the above embodiment, the rotary cleaning device 3 may not be used. For example, the substrate can be cleaned by a method in which the hydrofluoric acid solution is stored in a tank, and the substrate is dipped in the tank.

Further, the ozone water can be stored in a tank, and the substrate is dipped into the ozone water in the tank.

Further, although the oxide film is formed using the ozone water in the oxide film forming step of the above embodiment, the scope of the present invention is not limited thereto. In other words, any liquid can be used as long as the oxide film 13 can be formed on the surface of the substrate 11 without exposing the fault inside the substrate 11 (which is not exposed to the surface of the substrate 11) to the surface of the substrate 11. For example, aqueous hydrogen peroxide can be used for forming the oxide film 13 on the surface of the substrate 11.

By using the aqueous hydrogen peroxide, the oxide film 13 can be formed on the surface of the substrate 11 without exposing the fault inside the substrate 11 (which is not exposed to the surface of the substrate 11) to the surface of the substrate 11, so that the same advantages as the above embodiment also can be achieved. Namely, the number of the stacking fault of the epitaxial layer 12 can be significantly reduced.

Further, in the oxide film forming step, so called SC-2 cleaning, i.e. cleaning with a mixed solution of aqueous hydrogen peroxide and hydrochloric acid, may be carried out. In this case, the oxide film 13 also can be formed on the surface of the substrate 11 without exposing the fault inside the substrate 11 (which is not exposed to the surface of the substrate 11) to the surface of the substrate 11.

EXAMPLE

An example of the present invention will be described below.

The epitaxial silicon wafer was produced by the same method as the above embodiment.

(Hydrofluoric Acid Cleaning Step)

A silicon single crystal substrate doped with nitrogen of $4 \times 10^{13}$ atoms/cm$^3$ to $5 \times 10^{13}$ atoms/cm$^3$ was prepared for use.

The silicon single crystal substrate has a diameter of 300 mm and is a P-type silicon substrate doped boron in addition to nitrogen. The silicon single crystal substrate has an electrical resistivity of 10 Ω·cm.

The oxide film on the surface of the substrate and the inner wall oxide film in the COP exposed to the surface of the substrate were removed by cleaning the surface of the substrate with hydrofluoric acid solution. The rotary cleaning device used in the above embodiment was used for cleaning the substrate. The concentration of the hydrofluoric acid solution was 10%, the rotating speed of the substrate was set to 2 rpm, and the processing time was 90 seconds.

(Oxide Film Forming Step)

The substrate surface having been cleaned with the hydrofluoric acid solution was cleaned with ozone water to form an oxide film. The rotary cleaning device used in the above embodiment was used for cleaning the substrate.

The concentration of the ozone water was 20 ppm, and the rotating speed of the substrate was set to 500 rpm.

(Epitaxial Layer Forming Step)

The heat treatment was performed on the substrate for 70 seconds at 1145° C. under the atmosphere of hydrogen.

Next, the epitaxial layer having thickness of 4 μm was formed while heating the substrate at 1130° C. An epitaxial silicon wafer was thus prepared.

(Evaluation)

Counting SFs (stacking faults) on the epitaxial layer of the obtained epitaxial silicon wafer revealed that there are five SFs on the epitaxial layer.

The above example confirmed the fact that the number of the stacking fault of the epitaxial layer is significantly small.

INDUSTRIAL APPLICABILITY

The present invention can be applied to a method for producing epitaxial silicon wafer.

The invention claimed is:

1. A method for producing an epitaxial silicon wafer which includes a substrate obtained by cutting a nitrogen-doped silicon single crystal produced by Czochralski method and an epitaxial layer formed on the substrate, the method comprising:
    a hydrofluoric acid cleaning step for cleaning the substrate with a liquid containing hydrofluoric acid;
    an oxide film forming step for forming an oxide film on the surface of the substrate without exposing an unexposed fault inside the substrate to the surface of the substrate; and
    an epitaxial layer forming step for, after performing a heat treatment on the substrate on which the oxide film is formed, forming an epitaxial layer on the substrate.

2. The method for producing the epitaxial silicon wafer according to claim 1, wherein:
    in the oxide film forming step, the oxide film is formed on the surface of the substrate by cleaning the surface of the substrate with an aqueous hydrogen peroxide solution or an ozone water solution.

3. The method for producing the epitaxial silicon wafer according to claim 2, wherein:
    in the hydrofluoric acid cleaning step, the substrate is cleaned using a rotary cleaning device which includes:
    a dropping section for dropping the liquid containing hydrofluoric acid on one surface of the substrate;
    a holding section for holding the other surface of the substrate; and
    a rotating section for rotating the substrate with an axis passing through the surface of the substrate held by the holding section as a rotation center axis,
    and wherein the dropping section drops the liquid containing hydrofluoric acid to clean the substrate while rotating the substrate at a rotating speed of 10 rpm or less by the rotating section.

4. The method for producing the epitaxial silicon wafer according to claim 1, wherein:
    in the hydrofluoric acid cleaning step, the substrate is cleaned using a rotary cleaning device which includes:
    a dropping section for dropping the liquid containing hydrofluoric acid on one surface of the substrate;
    a holding section for holding the other surface of the substrate; and
    a rotating section for rotating the substrate with an axis passing through the surface of the substrate held by the holding section as a rotation center axis,
    and wherein the dropping section drops the liquid containing hydrofluoric acid to clean the substrate while rotating the substrate at a rotating speed of 10 rpm or less by the rotating section.

* * * * *